United States Patent
Shufflebotham et al.

[11] Patent Number: 5,838,529
[45] Date of Patent: Nov. 17, 1998

[54] LOW VOLTAGE ELECTROSTATIC CLAMP FOR SUBSTRATES SUCH AS DIELECTRIC SUBSTRATES

[75] Inventors: Paul Kevin Shufflebotham, San Jose; Michael Scott Barnes, San Francisco, both of Calif.

[73] Assignee: LAM Research Corporation, Fremont, Calif.

[21] Appl. No.: 577,382

[22] Filed: Dec. 22, 1995

[51] Int. Cl.⁶ .................................................. H02N 13/00
[52] U.S. Cl. ............................................ 361/234; 279/128
[58] Field of Search .................................... 361/234, 230, 361/233; 279/128

[56] References Cited

U.S. PATENT DOCUMENTS

| | | | |
|---|---|---|---|
| 3,634,740 | 1/1972 | Stevko | 361/234 |
| 3,916,270 | 10/1975 | Wachtler et al. | |
| 4,184,188 | 1/1980 | Briglia | |
| 4,340,462 | 7/1982 | Koch | |
| 4,384,918 | 5/1983 | Abe | |
| 4,480,284 | 10/1984 | Tojo et al. | |
| 4,502,094 | 2/1985 | Lewin et al. | |
| 4,534,816 | 8/1985 | Chen et al. | |
| 4,551,192 | 11/1985 | Di Milia et al. | |
| 4,579,618 | 4/1986 | Celestino et al. | |
| 4,615,755 | 10/1986 | Tracy et al. | |
| 4,665,463 | 5/1987 | Ward et al. | |
| 4,692,836 | 9/1987 | Suzuki | |
| 4,724,510 | 2/1988 | Wicker et al. | |
| 4,948,458 | 8/1990 | Ogle | |
| 4,962,441 | 10/1990 | Collins | 361/234 |
| 5,013,400 | 5/1991 | Kurasaki et al. | |
| 5,055,964 | 10/1991 | Logan et al. | |
| 5,160,152 | 11/1992 | Toraguchi et al. | |
| 5,191,506 | 3/1993 | Logan et al. | 361/234 |
| 5,200,232 | 4/1993 | Tappan et al. | |
| 5,238,499 | 8/1993 | van de Ven et al. | |
| 5,262,029 | 11/1993 | Erskine et al. | |
| 5,315,473 | 5/1994 | Collins et al. | |
| 5,326,725 | 7/1994 | Sherstinsky et al. | |
| 5,350,479 | 9/1994 | Collins et al. | |

FOREIGN PATENT DOCUMENTS

| | | |
|---|---|---|
| 0506537 A1 | 9/1992 | European Pat. Off. |
| 0512936 A1 | 11/1992 | European Pat. Off. |
| WO 91/03833 | 3/1991 | WIPO |

OTHER PUBLICATIONS

Reactive Ion Etching Technology In Thin–Film–Transistor Processing, Y. Kuo, IBM J. Res. Develop., vol. 36, No. 1 (Jan. 1992), pp. 69–75.

GPI WEB Client abstract of JP357196211A to Ishikawa et al., Dec. 1982.

*Primary Examiner*—Fritz Fleming
*Attorney, Agent, or Firm*—Burns, Doane, Swecker & Mathis, L.L.P.

[57] ABSTRACT

An electrostatic clamp for dielectric substrates is operated with a low voltage electric source by reducing the width of electrode lines to less than 100 μm and by reducing the spacing between adjacent electrode lines to less than 100 μm. The electrostatic clamp includes an array of electrodes such as aluminum formed on a base of insulating material such as glass and covered by an insulating layer such as nitride which covers and protects the electrodes. Electrical contacts apply voltages of opposite polarities to alternating electrode lines to create a non-uniform electric field which causes a dielectric substrate to be pulled toward the region of highest electric field. The reduced width electrode lines and spacings are created by the use of micro-lithographic techniques including thin film deposition and etching for formation of the electrode and the coating layers.

29 Claims, 4 Drawing Sheets

LOW VOLTAGE ELECTROSTATIC CLAMP FOR SUBSTRATES SUCH AS DIELECTRIC SUBSTRATES

FIELD OF THE INVENTION

The present invention relates to an electrostatic clamp for holding substrates in a vacuum processing chamber, and more particularly, the present invention relates to a low voltage electrostatic clamp for clamping dielectric substrates.

DESCRIPTION OF THE RELATED ART

Vacuum processing chambers are generally used for etching and chemical vapor depositing (CVD) of materials on substrates by supplying an etching or deposition gas to the vacuum chamber and application of an RF field to the gas. Examples of parallel plate, transformer coupled plasma (TCP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Mechanical clamps generally employ a clamp ring which surrounds the substrate and presses down on the top surface of the substrate around its periphery. Further examples of mechanical clamping rings are disclosed in U.S. Pat. Nos. 4,615,755; 5,013,400; and 5,326,725. Due to the fact that these known mechanical clamps cover the edge portions of the substrate, mechanical clamps reduce the area of the substrate which is able to be processed. Some additional drawbacks of mechanical clamps are that the clamp ring may cause damage to the edge of the substrate or may cause particles to become dislodged and contaminate the substrate in the chamber. Although mechanical clamps are suitable for use in many applications with small substrates, when large substrates such as flat panel displays are processed using mechanical clamps, the panels may have a tendency to become bowed due to the supply of pressurized gas used for increasing thermal conduction between the substrate and the water cooled substrate holder.

Substrates used to make flat panel displays may have dimensions of about 320 mm×340 mm, 360 mm×465 mm, or as large as 600 mm×720 mm with thicknesses of 0.7 mm or 1.1 mm and such substrates can be used for lap top computer screens. A discussion of flat panel display processing can be found in an article by Y. Kuo entitled "Reactive ion etching technology in thin-film-transistor processing," IBM J. Res. Develop., V. 36, No. 1, January 1992. In the past, these large flat panel display substrates have been held in place in processing chambers by the use of mechanical clamps. However, mechanical clamps have the disadvantages discussed above.

Substrates including flat panel displays and smaller substrates can be cooled by the substrate holder during certain processing steps. Such cooling is performed by the application of an inert gas, such as helium, between the substrate holder and the opposed surface of the substrate. For instance, see U.S. Pat. Nos. 5,160,152; 5,238,499; 5,350, 479; and 5,534,816. The cooling gas typically fills channels or a pattern of grooves in the substrate holder and applies a back pressure to the substrate which tends to cause the substrate to become bowed upward at the center when the substrate is held only along the edges by a mechanical clamping apparatus. This bowing effect is even more pronounced for large substrates such as the type used to make flat panel displays. The bowing of the panel is undesirable since it causes non-uniform heat transfer to the substrate holder thus adversely affecting the processing of the panel.

Electrostatic chucks are used for holding semiconducting and conducting substrates in place in a vacuum chamber in situations where it is desirable to avoid a clamping ring which extends over a portion of the substrate upper surface. Electrostatic chucks of the monopolar type utilize a single electrode. For instance, see U.S. Pat. No. 4,665,463. Electrostatic chucks of the bipolar type utilize mutual attraction between two electrically charged capacitor plates which are separated by a dielectric layer. For instance, see U.S. Pat. Nos. 4,692,836 and 5,055,964. An electrostatic chuck generally comprises an electrode with a dielectric layer formed on the electrode. A substrate of conductive or semiconductive material which is placed on the dielectric layer is attracted toward the electrode. Although this electrostatic attraction can be obtained between semiconducting and conducting substrates and an electrostatic chuck, this type of electrostatic attraction cannot be obtained with dielectric materials. With respect to conducting and semiconducting substrates, electrostatic chucks are beneficial because they exert a holding force on the entire substrate which counteracts the force of the cooling gas applied to the back of the substrate and does not cause the substrate to bow or warp.

The benefits of an electrostatic chuck would be highly desirable for use with flat panel displays. However, because flat panel displays are generally made of non-conductive materials, such as glass, conventional electrostatic chucks cannot be used.

SUMMARY OF THE INVENTION

The device according to the present invention addresses the disadvantages of the prior art by providing an electrostatic clamp which may be used for dielectric substrates. The electrostatic clamp can be used in a variety of manufacturing processes such as etching, plasma CVD, thermal CVD, RTP, implantation, sputtering, resist stripping, resist coating, lithography, substrate handling, etc. The electrostatic clamp according to the present invention operates at low voltages thereby avoiding problems associated with high voltage ESC systems. According to one aspect of the present invention, an electrostatic clamp for clamping dielectric substrates includes an array of electrodes formed on a base, wherein the width of each of the electrodes in the array of electrodes is less than approximately 100 $\mu$m, and the spacing between the electrodes is less than approximately 100 $\mu$m. A source of electrical power is connected to alternating electrodes in the array of electrodes.

According to another aspect, the present invention involves an electrostatic clamp for clamping dielectric substrates including an array of electrodes formed on a base, each of the electrodes in the array of electrodes having an electrode width and a spacing between the electrodes, and an insulating layer covering the array of electrodes. A first source of electrical power is connected via a first electrical contact to alternating electrodes in the array of electrodes and a second source of electrical power is connected via a second electrical contact to remaining electrodes in the array of electrodes which are not connected to the first power source. The power sources apply voltages of opposite polarity and magnitudes of less than 1 kV to the first and second electrical contacts, wherein the electrode width and spacing is small enough that less than 1 kV applied to the first and second electrical contacts provides a sufficient clamping force to clamp a dielectric substrate while opposing an opposite force of at least 2 Torr of backside pressure.

According to another aspect of the invention, a method of making an electrostatic clamp includes depositing a thin metal film on an electrically insulting substrate, forming an array of electrodes by etching the thin metal film by the use of micro-lithographic technologies, wherein the electrodes which are formed by the etching have widths of less than approximately 100 µm, and spacings between the electrodes are less than approximately 100 µm. The array of electrodes is coated with an insulating film such as silicon nitride, aluminum oxide, silicon dioxide and/or boron nitride and alternating electrodes are connected to a common electrical contact.

The invention also provides a method of processing a substrate in a process chamber having an electrostatic clamp for supporting the substrate during processing thereof, wherein the method comprises: supplying a substrate to the process chamber at a position above the electrostatic clamp, the clamp including electrodes having widths of less than approximately 100 µm and spacings between electrodes of less than approximately 100 µm; clamping the substrate by supplying sufficient electrical power to the clamp to electrostatically attract the substrate against the upper surface of the clamp; and processing the substrate. The process can further include supplying a heat transfer gas between the lower surface of the substrate and the upper surface of the clamp. For instance, the upper surface of the substrate can be etched or coated during the processing step. The process chamber can be part of an ECR reactor, TCP reactor or parallel plate reactor. The clamp can be a bipolar electrostatic chuck and the substrate can be a glass panel suitable for use in making a flat panel display or a semiconductor wafer. The clamp can be supplied DC voltage of 50 to 1000 volts during the clamping step. In order to cool the substrate, helium gas can be supplied to a space between the lower surface of the substrate and the upper surface of the clamp by passing the helium through one or more channels in the clamp.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

Figure 1:
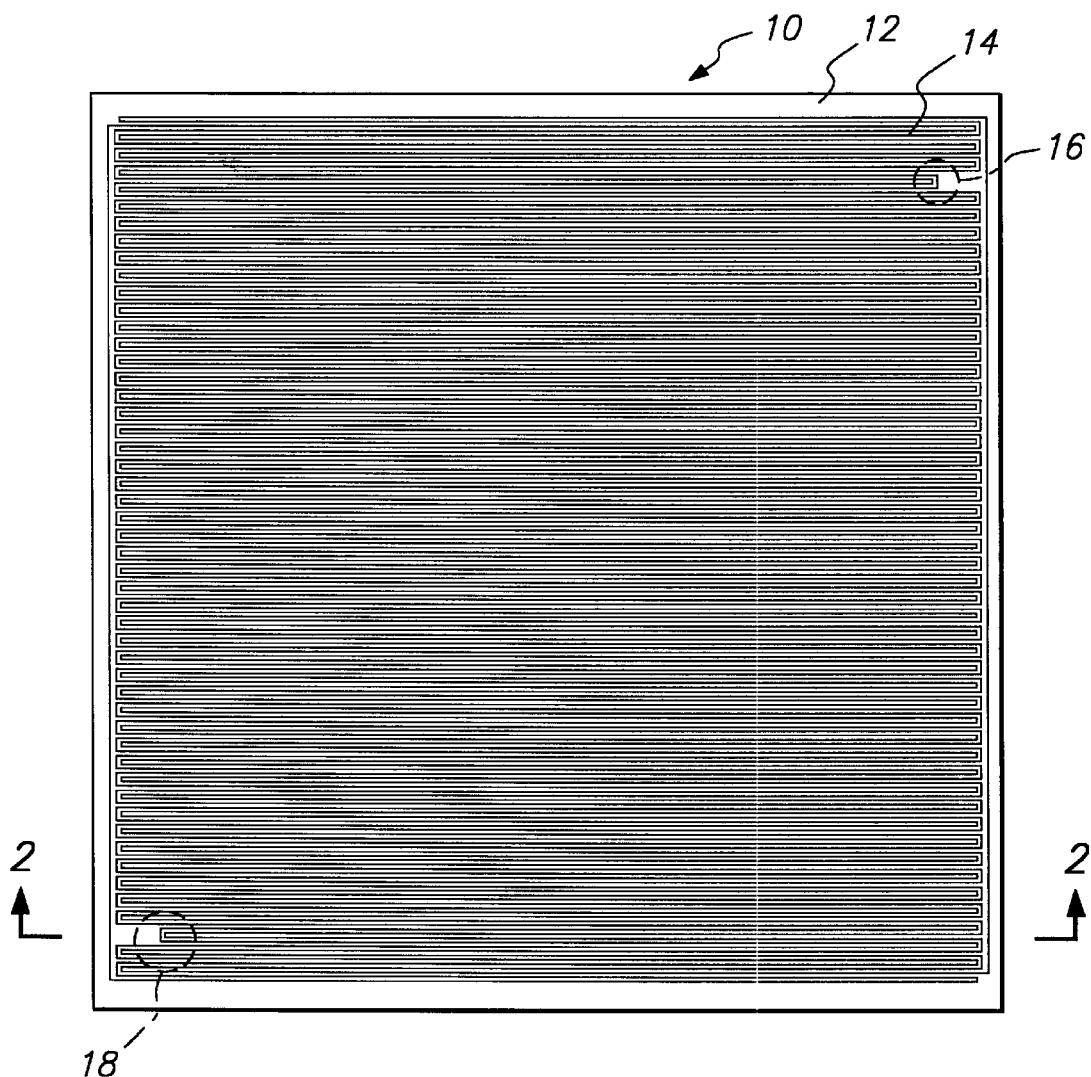
FIG. 1 is a top view of an electrostatic clamp according to the present invention wherein electrode lines are enlarged for clarity.
Figure 2:
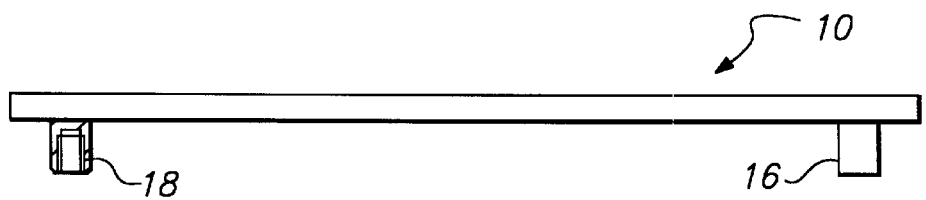
FIG. 2 is a cross-sectional side view of the electrostatic clamp taken along line 2—2 of FIG. 1.

The present invention provides an electrostatic clamp 10 as shown in FIGS. 1 and 2 which can be used to clamp substrates such as large dielectric substrates within a processing chamber such as a vacuum chamber. Dielectric objects can be electrostatically clamped by immersing the dielectric object in a non-uniform electric field. The non-uniform electric field produces a force which tends to pull the dielectric object into the region of the highest electric field.

The electrostatic clamp 10 according to the present invention includes a base 12 of dielectric material such as glass, alumina, etc., on which a plurality of electrodes 14 of electrically conductive material such as aluminum, copper, tungsten, etc., are formed as spaced-apart lines on the base. Preferably, the pattern of the electrodes 14 formed on the base 12 is an interdigitated pattern of two sets of alternating parallel conductor lines. However, other electrode patterns, such as a concentric circular pattern or an irregular pattern can also be used. The pattern may be interrupted by lifter pin holes (not shown) or other features which may be located on the surface of the electrostatic clamp 10. To provide power of opposite polarity to the two sets of conductor lines, electrical connectors 16, 18 passing through holes in the base connect the conductor lines to suitable power sources. The contacts can thus deliver the desired voltage to the electrostatic clamp 10. Alternating electrodes 14 in the electrode array are connected to one electrical contact 16, while opposite alternating electrodes are connected to the other of the electrical contacts 18.

Figure 5:
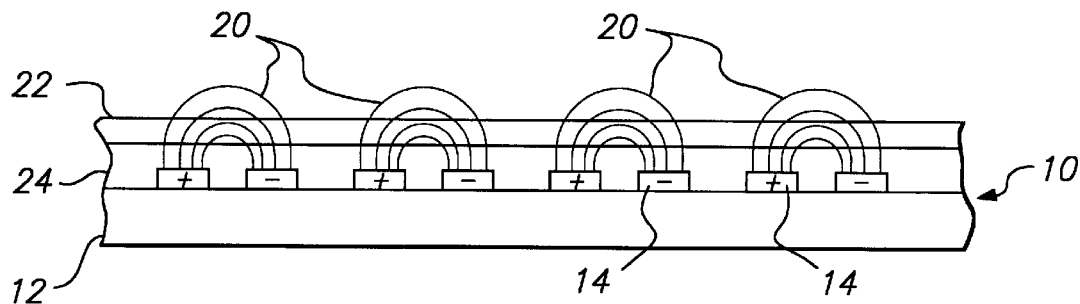
FIG. 5 is an enlarged side view of an electrostatic clamp showing the electric fields created.

As shown in FIG. 5, adjacent electrodes 14 are oppositely charged by one or more voltage sources connected to the electrical contacts 16, 18. The oppositely charged electrodes create a non-uniform electric field 20 above dielectric coating 24. The non-uniform electric field 20 causes a dielectric workpiece 22 which is placed on the dielectric coating 24 of the electrostatic clamp 10 to be pulled toward the region of the highest electric field. The region of highest electric field is generally located between the oppositely charged electrodes.

Conventional electrostatic clamps used for clamping semiconducting or conducting substrates such as silicon wafers include spaced-apart electrode lines with line widths of approximately 3 mm and spacings between lines of approximately 1 mm. If such an electrostatic clamp was used to hold a dielectric substrate, the voltage required to create the necessary clamping force which overcomes the backside pressure applied by the cooling gas would be approximately 5000 volts.

The attractive force generated by known electrostatic clamps on a dielectric workpiece is relatively weak, since conventional manufacturing methods produce electrode lines and spaces between electrode lines which are no less than several hundred microns wide. With such arrangements, thousands of volts are required to hold a dielectric substrate 22 (such as the type used to produce flat panel displays) with the several Torr required to hold the substrate securely on the electrostatic clamp 10. These high voltages are undesirable for a number of reasons including, safety concerns, potential damage to devices being processed on the substrate, added design complexity, high power consumption and high costs associated with design of the electrostatic clamp and electrical circuits capable of delivering and handling the high voltages. High voltages are also undesirable due to the potential to cause arcing or other malfunctions as a result of irregularities in the electrostatic clamp or the processing system.

Figure 3:
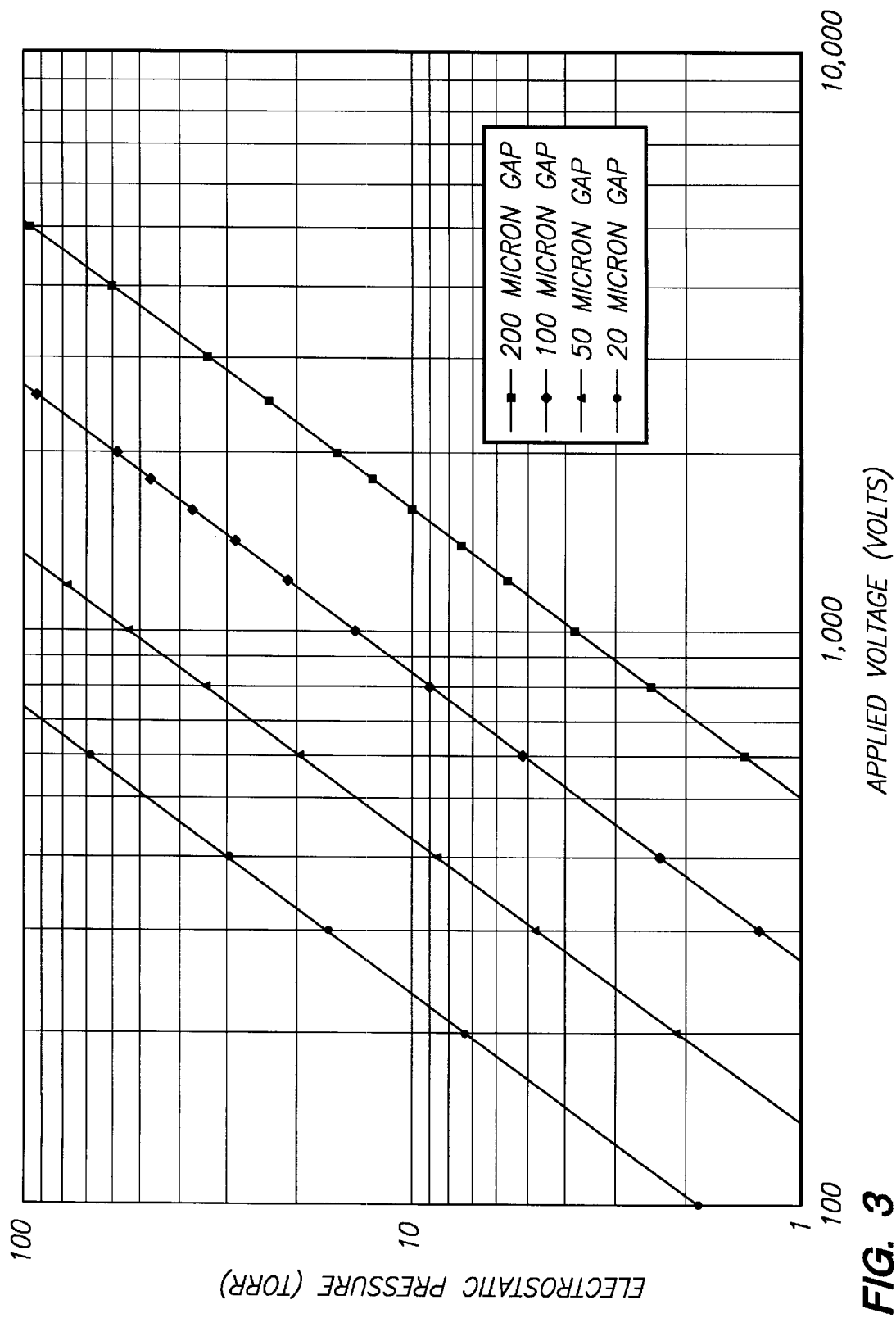
FIG. 3 is a graph of the electrostatic pressure in Torr versus applied voltage in volts for an electrostatic clamp according to the present invention having 10 µm wide electrode lines and spaces between the electrodes of 20, 50, 100, and 200 µm.
Figure 4:
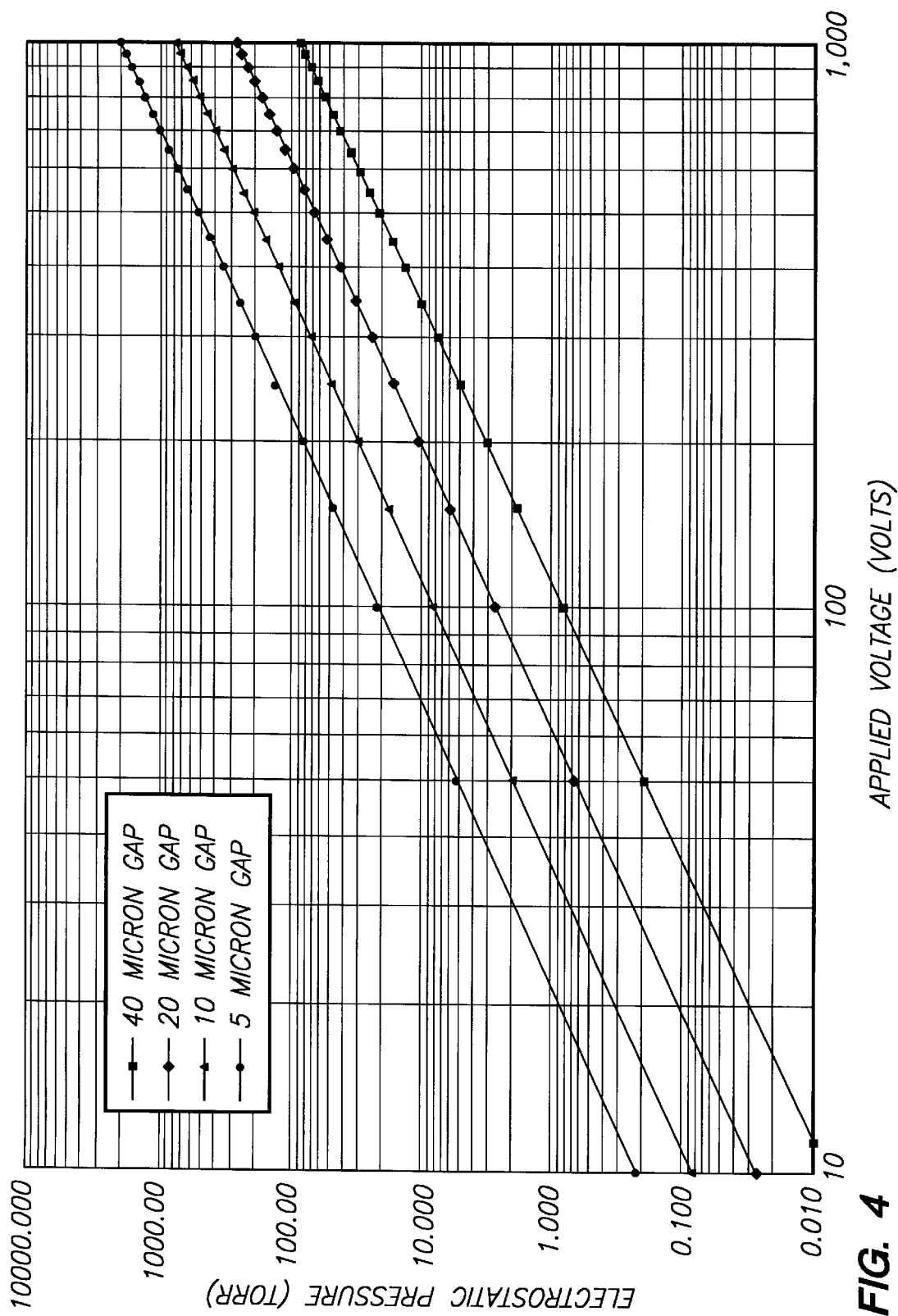
FIG. 4 is a graph of electrostatic pressure in Torr versus applied voltage in volts for an electrostatic clamp according to the present invention having 10 µm wide electrode lines and spaces between the electrodes of 5, 10, 20, and 40 µm.

FIG. 3 illustrates the electrostatic pressure acting on a dielectric substrate for different applied voltages with an electrostatic clamp 10 having electrode line widths of 10 μm. As shown in FIG. 3, when the line width is reduced to 10 μm, an electrostatic pressure of almost 4 Torr can be created by application of only 1000 volts to an electrostatic clamp with a spacing between electrodes of 200 μm. The voltage required to create a desired clamping force can be progressively decreased by decreasing the spacing between the electrodes to 100 μm, 50 μm and 20 μm, as shown in FIG. 3. The voltages required to operate the electrostatic clamp 10 may be still further reduced by decreasing the spacing between electrodes from 40 μm to 20 μm, 10 μm or 5 μm, as shown in FIG. 4.

As explained above, the attractive force generated by electrostatic clamps can be greatly increased by electrode lines and spaces which are substantially smaller than conventional electrostatic clamps. However, conventional manufacturing methods can only produce electrode lines and spaces which are no less than several hundred microns wide. Thus, there is a need in the art for a process capable of providing electrostatic clamps having a large number of closely spaced conductor lines while minimizing the expense of making such lines on a large scale such that the clamp can be used for clamping large dielectric substrates such as flat panel displays. It should be noted, however, that manufacture of electrostatic clamps with small electrode line widths and spacings is further complicated by the requirements in a vacuum processing chamber for vacuum compatibility, high holding forces, good thermal conductivity, and excellent mechanical abrasion resistance.

Semiconductor wafer processing technology is unsuitable for manufacturing devices having dielectric substrates. Thus, in order to achieve extremely small electrode lines with very close spacing over a large area with plasma-compatible materials on a dielectric substrate or base, the electrostatic clamp 10 of the present invention can be manufactured by flat panel display (AMLCD) manufacturing technology. A suitable method of making the electrostatic clamp according to the present invention includes providing a dielectric substrate or base 12 on which the electrodes 14 are formed by pattern micro-lithography and etching using technologies which are generally used AMLCD manufacturing.

Figure 6:
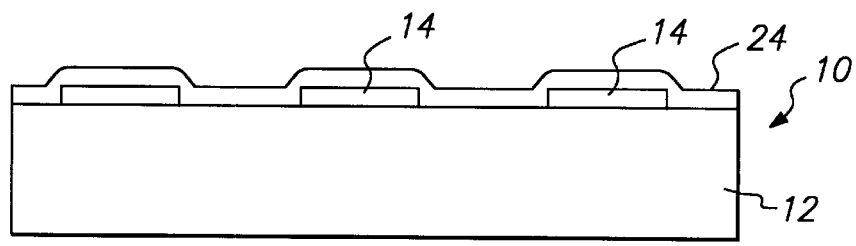
FIG. 6 is an enlarged side sectional view of the electrostatic clamp according to the present invention.

An enlarged cross-sectional view of a portion of an electrostatic clamp 10 according to the present invention is shown by way of example in FIG. 6. The electrostatic clamp 10 includes a base 12 which is preferably formed of glass or quartz. The metal electrodes 14 are formed on the base 12 in a manner which will be described in more detail below. The electrodes 14 are preferably formed of electrically conductive material such as aluminum or polysilicon. However, the electrodes may also be formed of other materials commonly used for electrodes such as Cr, Mo, indium-tin-oxide, or other less common metals. The electrodes 14 are covered with an electrically insulating film 24 which protects the electrodes from abrasion, chemical attack, electrical breakdown and separates the substrate to be processed from the electrodes. The insulating film 24 is preferably formed of PECVD nitride such as silicon nitride, silicon dioxide, boron nitride, aluminum oxide, or combinations thereof. However, other insulating materials, such as $SiO_2$ or $Si_3N_4$, may also be used. The use of nitride as a preferred coating is selected because it gives the electrostatic clamp 10 an abrasion resistant upper surface which protects the electrodes 14, the nitride has a high dielectric constant which improves the clamping force applied to the workpiece, and the nitride has a high breakdown voltage.

The electrostatic clamp 10 according to the present invention may be formed by the following sequence of steps: 1) providing a bare clean glass substrate of an appropriate size; 2) deposit a thin metal film on the substrate by sputtering; 3) coat the thin metal film with photo-resist; 4) expose the photo-resist to ultraviolet light through a mask having a desired pattern and subsequently remove unexposed resist; 5) plasma or wet-chemical etch exposed metal, leaving behind an electrode array pattern; 6) strip remaining photo-resist from electrode pattern; 7) coat the electrode pattern with an electrically insulating film; and 8) connect alternating electrodes to electrical contacts. This process by which the electrostatic clamp according to the present invention may be manufactured is set forth by way of example only and is not intended as a limitation.

There are many variations on this process using flat panel display manufacturing methods. However, the variations on the method preferably include the use of micro-lithographic technology for patterning the electrodes in the form of a thin film, and the use of thin film deposition and etching technologies for formation of the electrode and coating layers.

The holding force of the electrostatic clamp according to the present invention increases as 1) the electrode line widths are reduced; 2) the spaces between the electrode lines are reduced; and 3) the coating layers are made thinner. As shown in FIGS. 3 and 4, electrode line widths and spacings of tens of microns result in acceptable clamping forces at tens or hundreds of volts rather than thousands of volts.

Figure 7:
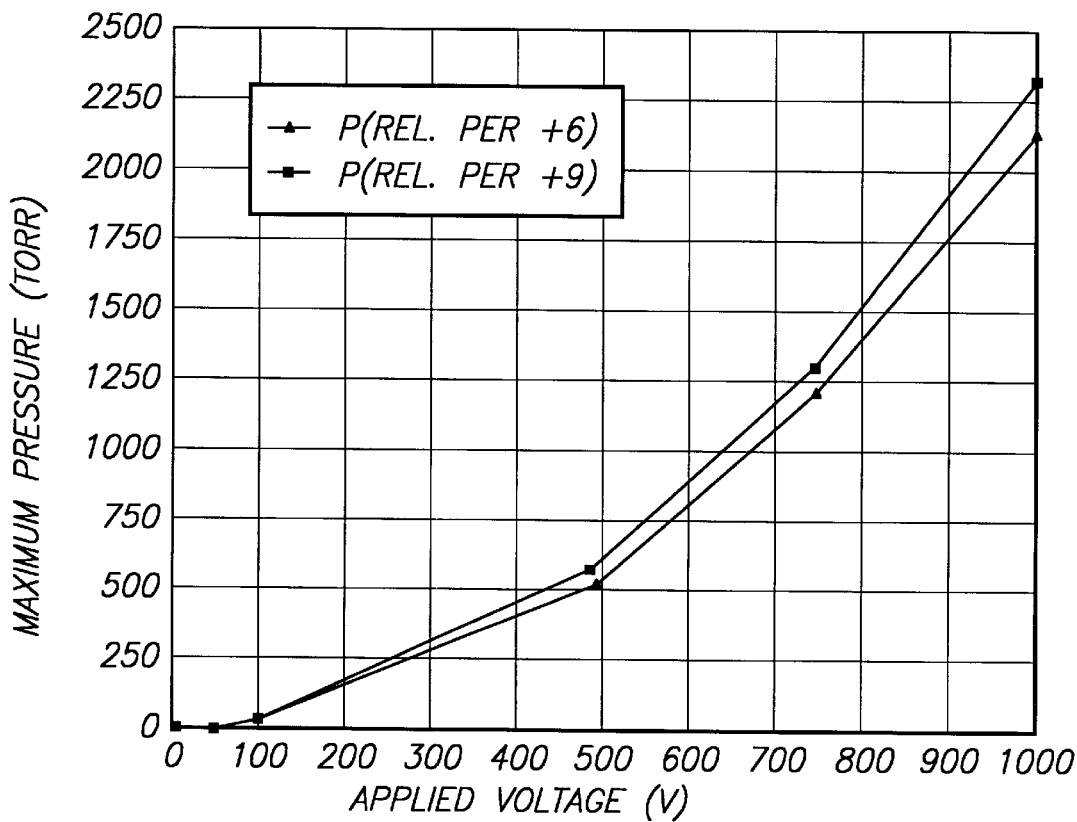
FIG. 7 is a graph of the effect of applied voltage on electrostatic clamp performance for two variations of the present invention.

The pressure exerted by the electrostatic clamp 10 is also affected by the dielectric constant of the insulating coating. FIG. 7 illustrates the effect of applied voltage on the performance of electrostatic clamp having electrodes with line widths of 10 μm, line spacings of 10 μm, and an insulating nitride coating of 1 μm. The two plots shown in FIG. 7 represent two different embodiments of the present invention having insulating coatings with dielectric constants of 6 and 9. As can be seen in the graph, the higher dielectric constant provides a higher clamping force for the same voltage.

While the invention has been described in detail with reference to preferred embodiments thereof, it will be apparent to one skilled in the art that various changes can be made, and equivalents employed without departing from the spirit and scope of the invention.

What is claimed is:

1. An electrostatic clamp for clamping dielectric substrates comprising:

an array of spaced-apart and electrically conductive electrodes formed on a dielectric base, wherein the width of each of the electrodes in the array of electrodes is less than approximately 100 μm, and the spacing between the electrodes is less than approximately 100 μm;

an electrical contact connected to a first group of the electrodes and a second electrical contact connected to a second group of the electrodes, the first and second groups of electrodes alternating with respect to each other in the array of electrodes.

2. The electrostatic clamp according to claim 1, wherein the width of the electrodes is less than approximately 50 µm.

3. The electrostatic clamp according to claim 1, wherein the spacing between the electrodes is less than approximately 50 µm.

4. The electrostatic clamp according to claim 1, wherein the spacing between the electrodes is approximately 5 to 20 µm and the width of the electrodes is approximately 5 to 20 µm.

5. The electrostatic clamp according to claim 1, wherein the array of electrodes is covered with a dielectric insulating layer.

6. The electrostatic clamp according to claim 5, wherein the insulating layer is formed of silicon nitride, silicon oxide, aluminum oxide, boron nitride or combinations thereof.

7. The electrostatic clamp according to claim 5, wherein the insulating layer has a thickness of less than 10 µm.

8. The electrostatic clamp according to claim 5, wherein the insulating layer has a dielectric constant in a range of 6 to 9.

9. The electrostatic clamp according to claim 1, wherein the base is formed of glass and the array of electrodes is formed of aluminum.

10. An electrostatic clamp for clamping dielectric substrates comprising:
    an array of electrodes formed on a base, each of the electrodes in the array of electrodes having an electrode width of less than approximately φµm and a spacing between electrodes;
    an insulating layer covering the array of electrodes;
    a first electrical contact connected to alternating electrodes in the array of electrodes;
    a second electrical contact connected to remaining electrodes in the array of electrodes which are not connected to the first electrical contact;
    a voltage source for applying voltages of less than 1 kV to the first and second electrical contacts, wherein the electrode width and spacing is small enough that less than 1 kV applied to the first and second electrical contacts provides a sufficient clamping force to clamp a dielectric substrate against at least 2 Torr of backside pressure.

11. The electrostatic clamp according to claim 10, wherein the spacing between the electrodes is less than approximately 100 µm.

12. The electrostatic clamp according to claim 10, wherein the spacing between the electrodes is approximately 5 to 50 µm and the spacing is approximately 5 to 50 µm.

13. A method of making an electrostatic clamp comprising:
    depositing a thin metal film on a dielectric substrate;
    forming an array of electrodes by etching the thin metal film by micro-lithography, wherein the electrodes which are formed by the etching have widths of less than approximately 100 µm, and spacings between the electrodes are less than approximately 100 µm;
    coating the electrodes with an electrically insulating film; and
    connecting common electrical contacts to alternating electrodes in the array of electrodes.

14. The method of making an electrostatic clamp according to claim 13, wherein the step of depositing the thin metal film includes depositing the thin metal film by sputtering.

15. The method of making an electrostatic clamp according to claim 13, wherein the step of etching the thin metal film comprises:
    coating the thin metal film with photo-resist;
    exposing the photo-resist through a mask;
    removing the unexposed photo-resist so as to provide exposed metal portions of the metal film; and
    etching the exposed metal portions so as to form the array of electrodes from the remainder of the metal film.

16. The method of making an electrostatic clamp according to claim 13, wherein the step of forming an array of electrodes includes forming electrodes wherein the width of the electrodes is approximately 5 to 50 µm.

17. The method of making an electrostatic clamp according to claim 13, wherein the step of forming an array of electrodes includes forming electrodes wherein the spacing between the electrodes is between 5 and 50 µm.

18. The method of making an electrostatic clamp according to claim 13, wherein the step of forming an array of electrodes includes forming electrodes having widths of approximately 5 to 20 µm and spacings between the electrodes of approximately 5 to 20 µm.

19. The method of making an electrostatic clamp according to claim 13, wherein the step of coating the electrodes with an insulating film includes coating the electrodes with a layer of silicon nitride, boron nitride, aluminum oxide and/or silicon dioxide.

20. The method of making an electrostatic clamp according to claim 13, wherein the step of depositing the thin metal film includes depositing a thin film of aluminum, chromium, tungsten, molybdenum or metal oxide on a glass substrate.

21. The method of claim 20, wherein the array of electrodes is supplied DC voltage of less than 1000 volts during the clamping step.

22. A method of processing a substrate in a process chamber having an electrostatic clamp for supporting the substrate during processing thereof, the method comprising:
    supplying a substrate to the process chamber at a position above the electrostatic clamp, the clamp including an array of electrodes having conductor widths of less than 100 µm and spaces between the electrodes of less than 100 µm;
    clamping the substrate by supplying sufficient voltage to the clamp to electrostatically attract the substrate against the upper surface of the clamp; and
    processing an exposed surface of the substrate.

23. The method of claim 22, further comprising supplying a heat transfer gas between the lower surface of the substrate and the upper surface of the clamp.

24. The method of claim 22, wherein the upper surface of the substrate is etched in a plasma environment during the processing step.

25. The method of claim 22, wherein the upper surface of the substrate is coated in a plasma environment during the processing step.

26. The method of claim 22, wherein the process chamber is part of an ECR reactor, TCP reactor or parallel plate reactor.

27. The method of claim 22, wherein the clamp is a bipolar electrostatic chuck and the substrate is a glass panel suitable for use in making a flat panel display.

28. The method of claim 22, wherein the clamp is a bipolar electrostatic chuck and the substrate is a semiconductor wafer.

29. The method of claim 22, wherein helium gas is supplied to a space between the lower surface of the substrate and the upper surface of the clamp by passing the helium through one or more channels in the clamp.

* * * * *

UNITED STATES PATENT AND TRADEMARK OFFICE
CERTIFICATE OF CORRECTION

PATENT NO.     : 5,838,529
DATED          : November 17, 1998
INVENTOR(S)    : Shufflebotham et al.

It is certified that error appears in the above-identified patent and that said Letters Patent is hereby corrected as shown below:

Column 7,
Line 29, please delete "$\Phi\mu$m" and insert -- $100\mu$m --.

Signed and Sealed this

Twenty-fourth Day of February, 2004

JON W. DUDAS
*Acting Director of the United States Patent and Trademark Office*